United States Patent
Lai

(10) Patent No.: US 9,514,982 B2
(45) Date of Patent: Dec. 6, 2016

(54) SEMICONDUCTOR STRUCTURE AND MANUFACTURING METHOD OF THE SAME

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/518,050

(22) Filed: Oct. 20, 2014

(65) Prior Publication Data

US 2016/0111366 A1    Apr. 21, 2016

(51) Int. Cl.
*H01L 27/115*     (2006.01)
*H01L 21/768*     (2006.01)

(52) U.S. Cl.
CPC . *H01L 21/76838* (2013.01); *H01L 2924/0002* (2013.01)

(58) Field of Classification Search
None
See application file for complete search history.

(56) References Cited

U.S. PATENT DOCUMENTS

2014/0264898 A1*  9/2014  Hu ................... H01L 21/768
                                                    257/773

FOREIGN PATENT DOCUMENTS

TW       201426992 A      7/2014

OTHER PUBLICATIONS

TIPO Office Action dated May 5, 2016 in Taiwan application (No. 103134960).
Kim, et al.: "Novel 3-D Structure for Ultra High Density Flash Memory with VRAT (Vertical-Recess-Array-Transistor) and PIPE (Planarized Integration on the same PlanE)"; 2008 Symposium on VLSI Technology Digest of Technical Papers; pp. 122-123.

* cited by examiner

*Primary Examiner* — Ali Naraghi
(74) *Attorney, Agent, or Firm* — McClure, Qualey & Rodack, LLP

(57) ABSTRACT

A semiconductor structure and a manufacturing method thereof are provided. The semiconductor structure includes a substrate having a trench, a stacked strip structure formed in the trench, and at least a conductive structure. The stacked strip structure includes a plurality of interlaced conductive strips and insulating strips. Each of the conductive strips has a horizontal conductive segment and two vertical conductive segments connected to the corresponding horizontal conductive segment. Each of the insulating strips has a horizontal insulating segment and two vertical insulating segments. The conductive structure is electrically connected to at least one of the conductive strips. The stacked strip structure has a horizontal stacked portion corresponding to the horizontal conductive segments and two vertical stacked portions corresponding to the vertical conductive segments, wherein a width of the vertical stacked portions is larger than a thickness of the horizontal stacked portion.

9 Claims, 12 Drawing Sheets

SEMICONDUCTOR STRUCTURE AND MANUFACTURING METHOD OF THE SAME

BACKGROUND

Technical Field

The disclosure relates in general to a semiconductor structure and a manufacturing method thereof, and particularly to a semiconductor structure with enlarged electrical contact overlay window and a manufacturing method thereof.

Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof is in need. As such, the distance between electric contacts in the device is reduced, which increases the possibility of short circuit and decreases the stability of the device.

As such, it is desirable to develop a three-dimensional (3D) memory device with larger number of multiple stacked planes to achieve greater storage capacity, a small size, and yet having excellent stability.

SUMMARY

The disclosure is directed to a semiconductor structure and a manufacturing method thereof. In the semiconductor structures of the embodiments, the vertical stacked portion of the stacked strip structure has a width larger than the thickness of the horizontal stacked portion, such that the vertical stacked portion has an enlarged size, thereby the pitch of the vertical conductive segments is enlarged, the electrically contact overlay window between the stacked strip structure and the conductive structure is efficiently enlarged, and the possibility of short circuit is reduced.

According to an embodiment of the present disclosure, a semiconductor structure is provided. The semiconductor structure includes a substrate, a stacked strip structure, and at least a conductive structure. The substrate has a trench, and the stacked strip structure is formed in the trench. The stacked strip structure includes a plurality of interlaced conductive strips insulating strips. Each of the conductive strips has a horizontal conductive segment and two vertical conductive segments connected to the corresponding horizontal conductive segment. The horizontal conductive segment extends in a direction parallel to a bottom of the trench, and the vertical conductive segments extend in a direction perpendicular to the bottom of the trench. Each of the insulating strips has a horizontal insulating segment and two vertical insulating segments connected to the corresponding horizontal insulating segment. The vertical insulating segments extend in a direction parallel to the direction in which the vertical conductive segments extend. The conductive structure is electrically connected to at least one of the conductive strips. The stacked strip structure has a horizontal stacked portion corresponding to the horizontal conductive segments and two vertical stacked portions corresponding to the vertical conductive segments, wherein a width of the vertical stacked portions is larger than a thickness of the horizontal stacked portion.

According to another embodiment of the present disclosure, a manufacturing method of a semiconductor structure is provided. The manufacturing method includes the following steps: providing a substrate, comprising forming a trench in the substrate; forming a stacked strip structure in the trench, comprising: forming a plurality of conductive strips, wherein each of the conductive strips has a horizontal conductive segment and two vertical conductive segments connected to the corresponding horizontal conductive segment, the horizontal conductive segments extend in a direction parallel to a bottom of the trench, and the vertical conductive segments extend in a direction perpendicular to the bottom of the trench; and forming a plurality of insulating strips, wherein the conductive strips and the insulating strips are interlaced, each of the insulating strips has a horizontal insulating segment and two vertical insulating segments connected to the corresponding horizontal insulating segment, and the vertical insulating segments extend in a direction parallel to the direction in which the vertical conductive segments extend; and forming at least one conductive structure electrically connected to at least one of the conductive strips; wherein the stacked strip structure has a horizontal stacked portion corresponding to the horizontal conductive segments and two vertical stacked portions corresponding to the vertical conductive segments, and a width of the vertical stacked portions is larger than a thickness of the horizontal stacked portion.

The above and other embodiments of the disclosure will become better understood with regard to the following detailed description of the non-limiting embodiment(s). The following description is made with reference to the accompanying drawings.

DETAILED DESCRIPTION

In the embodiments of the present disclosure, a semiconductor structure and a method of manufacturing the same are provided. In the semiconductor structures of the embodiments, the vertical stacked portion of the stacked strip structure has a width larger than the thickness of the horizontal stacked portion, such that the vertical stacked portion has an enlarged size, thereby the pitch of the vertical conductive segments is enlarged, the electrically contact overlay window between the stacked strip structure and the conductive structure is efficiently enlarged, and the possibility of short circuit is reduced.

Figure 1:
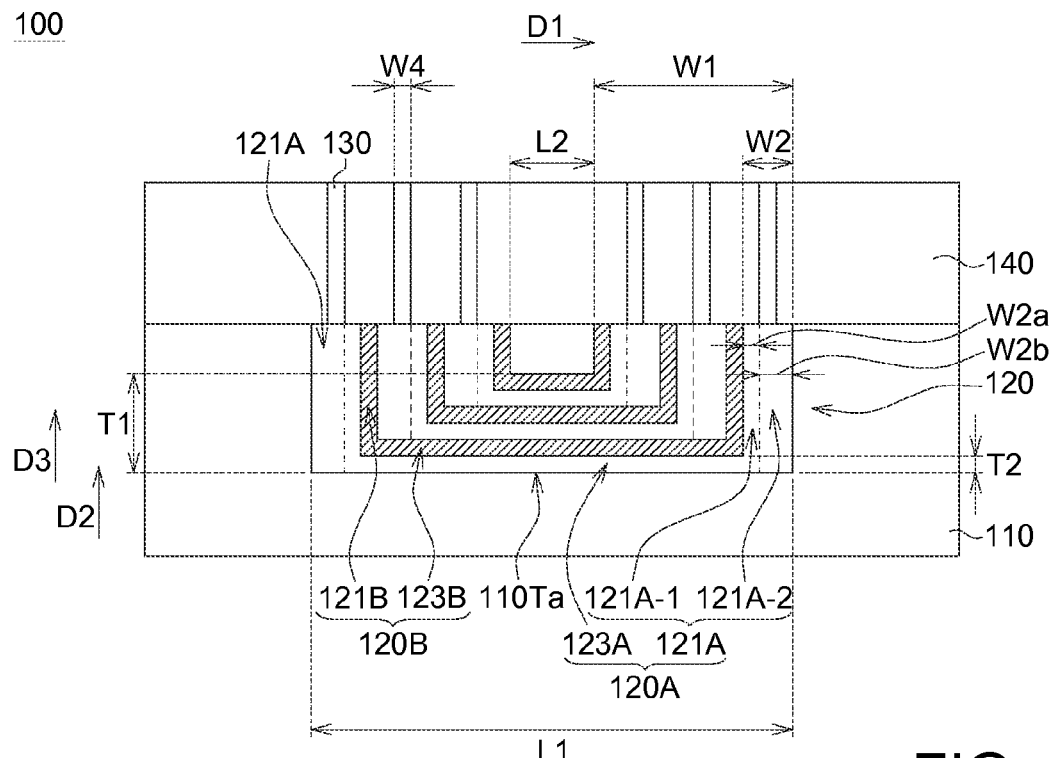
FIG. 1 shows a cross-sectional view of a semiconductor structure according to an embodiment of the present disclosure.

Referring to FIG. 1, a cross-sectional view of a semiconductor structure 100 according to an embodiment of the present disclosure is shown. The semiconductor structure 100 includes a substrate 110, a stacked strip structure 120, and at least one conductive structure 130. The substrate 110 has a trench 110T, and the stacked strip structure 120 is formed in the trench 110T. The stacked strip structure 120 includes a plurality of conductive strips 120A and a plurality of insulating strips 120B, and the conductive strips 120A and the insulating strips 120B are interlaced. The conductive structure 130 is electrically connected to at least one of the conductive strips 120A.

As shown in FIG. 1, each of the conductive strips 120A has a horizontal conductive segment 123A and two vertical conductive segments 121A connected to the corresponding horizontal conductive segment 123A. The horizontal conductive segments 123A extend in a direction D1 which is parallel to the bottom 110Ta of the trench 110T, and the vertical conductive segments 121A extend in a direction D2 which is perpendicular to the bottom 110Ta of the trench 110T. Each of the insulating strips 120B has a horizontal insulating segment 123B and two vertical insulating segments 121B connected to the corresponding horizontal insulating segment 123B. The vertical insulating segments 121B extend in a direction D3 parallel to the direction D2 in which the vertical conductive segments 121A extend.

As shown in FIG. 1, the stacked strip structure 120 has a horizontal stacked portion and two vertical stacked portions, the horizontal stacked portion corresponding to the horizontal conductive segments 123A and the two vertical stacked portions corresponding to the vertical conductive segments 121A. The width W1 of the vertical stacked portions is larger than the thickness T1 of the horizontal stacked portion. In other words, in the stacked strip structure 120, compared to the horizontal stacked portion having the thickness T1, the vertical stacked portions having the width W1 has an enlarged size, accordingly, the electrical contact overlay window between the stacked strip structure and the conductive structure 130 can be efficiently enlarged.

In the embodiment, as shown in FIG. 1, at least one of the conductive structures 130 is electrically connected to at least one of the vertical conductive segments 121A. Since the vertical stacked portion of the stacked strip structure 120 has an enlarged size (width W1), the pitch of the vertical conductive segments 121A is bigger, thereby the electrical contact overlay window between the stacked strip structure 120 and the conductive structure 130 is efficiently enlarged, and occurrences of short circuits are reduced.

In the embodiment, the substrate 110 is such as a metal oxide layer, the conductive strips 120A may include polysilicon, and the insulating strips 120B may include silicon oxide. In the present embodiment, as shown in FIG. 1, the stacked strip structure 120 includes interlaced three conductive strips 120A and three insulating strips 120B. However, the selection of numbers of the conductive strips 120A and the insulating strips 120B may depend on actual needs and is not limited thereto.

It is to be noted that the illustrations in drawings may not necessarily be drawn to scale. For example, as shown in FIG. 1, the ratio of the width W1 of the vertical stacked portion to the length L2 of the horizontal stacked portion is such as about from 1:1000 to 1:100000. That is, compared to the width W1 of the vertical stacked portion, the length L2 of the horizontal stacked portion is actually very long, up to several mms to cms.

In the present embodiment, as shown in FIG. 1, in the same conductive strips 120A, the width W2 of the vertical conductive segment 121A is larger than the thickness T2 of the corresponding horizontal conductive segment 123A. In the embodiment, the thickness T2 of the horizontal conductive segment 123A is about 100~500 Å. In the present embodiment, the width W4 of the conductive structure 130 is smaller than the width W2 of the vertical conductive segment 121A. In other words, the vertical conductive segment 121A can fully cover the contact end of the conductive structure 130; therefore, the electrical contact overlay window between the vertical conductive segment 121A and the conductive structure 130 can be efficiently enlarged, thereby providing an improved electrical contact between the stacked strip structure 120 and the conductive structure 130.

In the embodiment, as shown in FIG. 1, one vertical conductive segment 121A may include, such as, one vertical conductive layer 121A-1 and one conductive spacer 121A-2. The vertical conductive layer 121A-1 is in direct contact with the conductive spacer 121A-2, and the width W2$a$ of the vertical conductive layer 121A-1 combines the width W2$b$ of the conductive spacer 121A-2 to form the width W2 of the vertical conductive segment 121A. In the embodiment, the width W2$a$ of the vertical conductive layer may be larger than, equal to, or smaller than the width W2$b$ of the conductive spacer 121A-2. In the embodiment, the material of the vertical conductive layer 121A-1 may be the same with or different from the material of the conductive spacer 121A-2.

In the embodiment, as shown in FIG. 1, the semiconductor structure 100 may further include a dielectric structure 140 formed on the substrate 110. The conductive structure 130 is formed in the dielectric structure 140.

In one embodiment, the semiconductor structure 100 is such as a 3D memory device, and the stacked strip structure 120 is used as the word line.

Figure 2:
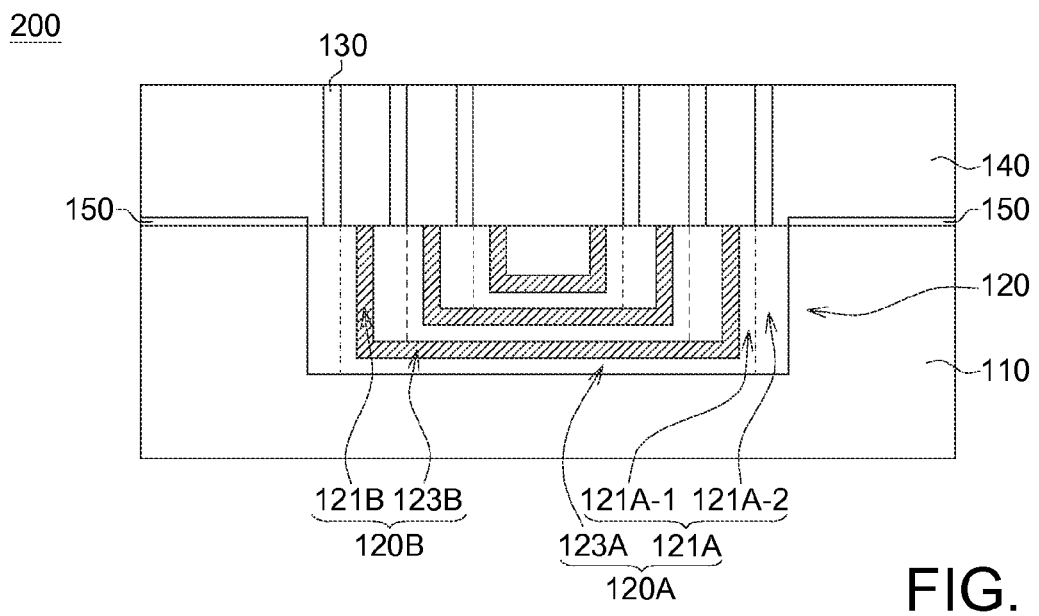
FIG. 2 shows a cross-sectional view of a semiconductor structure according to another embodiment of the present disclosure.

FIG. 2 shows a cross-sectional view of a semiconductor structure 200 according to another embodiment of the present disclosure. The elements in the present embodiment sharing the same labels with those in the previous embodiment are the same elements, and the description of which is omitted.

As shown in FIG. 2, the semiconductor structure 200 may further include an etching stop layer 150. The etching stop layer 150 is formed between the substrate 110 and the dielectric structure 140.

Figure 3:
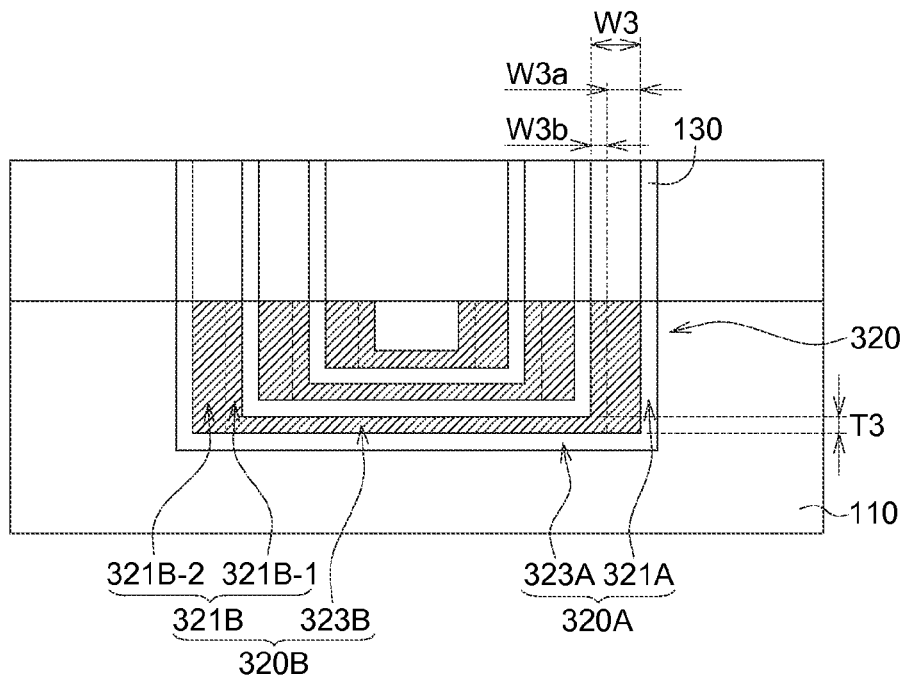
FIG. 3 shows a cross-sectional view of a semiconductor structure according to a further embodiment of the present disclosure.

FIG. 3 shows a cross-sectional view of a semiconductor structure 300 according to a further embodiment of the present disclosure. The elements in the present embodiment sharing the same or similar labels with those in the previous embodiment are the same or similar elements, and the description of which is omitted.

As shown in FIG. 3, in the semiconductor structure 300, the stacked strip structure 320 is formed in the trench 110T. The stacked strip structure 320 includes a plurality of conductive strips 320A and a plurality of insulating strips 320B, and the conductive strips 320A and the insulating strips 320B are interlaced. The conductive structure 130 is electrically connected to at least one of the conductive strips 320A.

In the present embodiment, as shown in FIG. 3, each of the conductive strips 320A has a horizontal conductive segment 323A and two vertical conductive segments 321A connected the corresponding horizontal conductive segment 323A. Each of the insulating strips 320B has a horizontal insulating segment 323B and two vertical insulating segments 321B connected to the corresponding horizontal insulating segment 323B.

In the present embodiment, as shown in FIG. 3, in the same insulating strip 320B, the width W3 of the vertical insulating segment 321B is larger than the thickness T3 of the corresponding horizontal insulating segment 323B. In the embodiment, the thickness T3 of the horizontal insulating segment 323B is such as about 100~500 Å.

In the embodiment, in the stacked strip structure 320, compared to the horizontal insulating segment 323B with the thickness T3, the vertical insulating segment 321B with the width W3 has an enlarged size; therefore, the pitch of the vertical conductive segments 321A is bigger, thereby the electrical contact overlay window can be efficiently enlarged, and occurrences of short circuits can be reduced.

In the embodiment, as shown in FIG. 3, one vertical insulating segment 321B may include, such as, one vertical insulating layer 321B-1 and one insulating spacer 321B-2. The vertical insulating layer 321B-1 is in direct contact with the insulating spacer 321B-2, the width W3a of the vertical insulating layer 321B-1 combines the width W3b of the insulating spacer 321B-2 to form the width W3 of the vertical insulating segment 321B. In the embodiment, the width W3a of the vertical insulating layer 321B-1 may be larger than, equal to, or smaller than the width W3b of the insulating spacer 321B-2. In the embodiment, the material of the vertical insulating layer 321B-1 may be the same or different from the material of the insulating spacer 321B-2.

Figure 4:
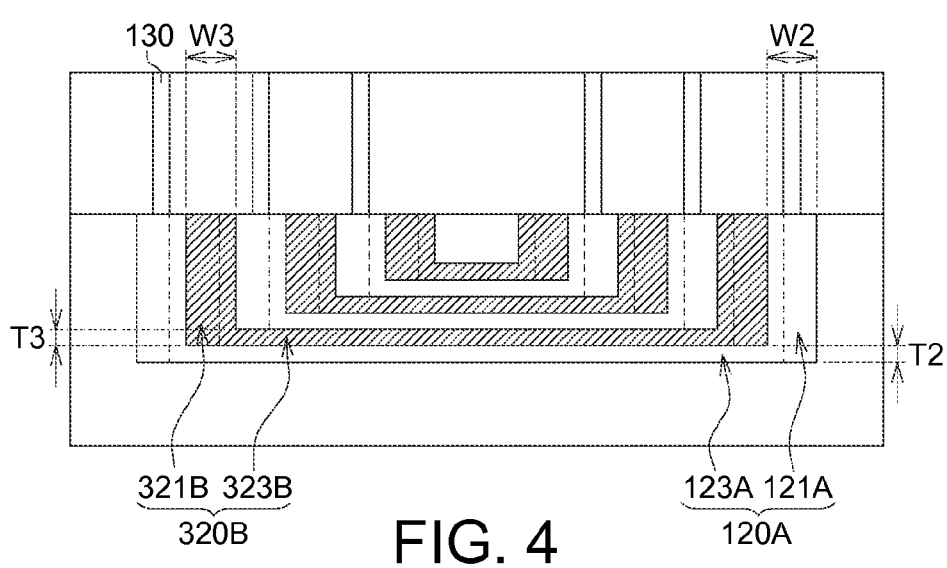
FIG. 4 shows a cross-sectional view of a semiconductor structure according to a still further embodiment of the present disclosure.

FIG. 4 shows a cross-sectional view of a semiconductor structure 400 according to a still further embodiment of the present disclosure. The elements in the present embodiment sharing the same or similar labels with those in the previous embodiment are the same or similar elements, and the description of which is omitted.

In the present embodiment, as shown in FIG. 4, in the semiconductor structure 400, in the same conductive strip 120A, the width W2 of the vertical conductive segment 121A is larger than the thickness T2 of the corresponding horizontal conductive segment 123A; in the same insulating strip 320B, the width W3 of the vertical insulating segment 321B is larger than the thickness T3 of the corresponding horizontal insulating segment 323B. In the embodiment, the thickness T2 of the horizontal conductive segment 123A is such as about 100~500 Å, and the thickness T3 of the horizontal insulating segment 323B is such as about 100~500 Å.

Referring to FIG. 1 and FIGS. 5A-5H, a manufacturing method of a semiconductor structure 100 according to an embodiment of the present disclosure is illustrated.

Figure 5A:
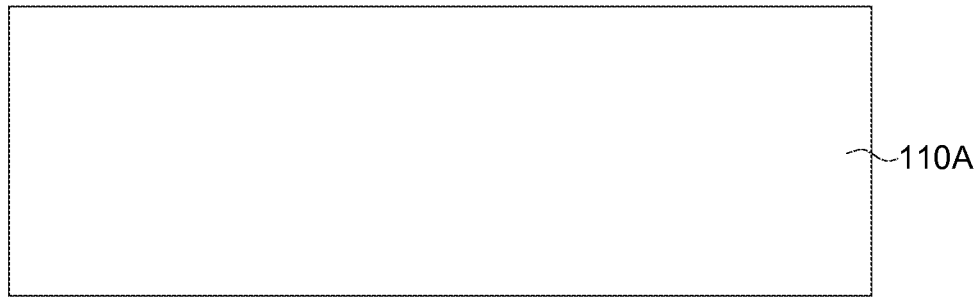
FIGS. 5A-5H illustrate a manufacturing method of a semiconductor structure according to an embodiment of the present disclosure.
Figure 5B:
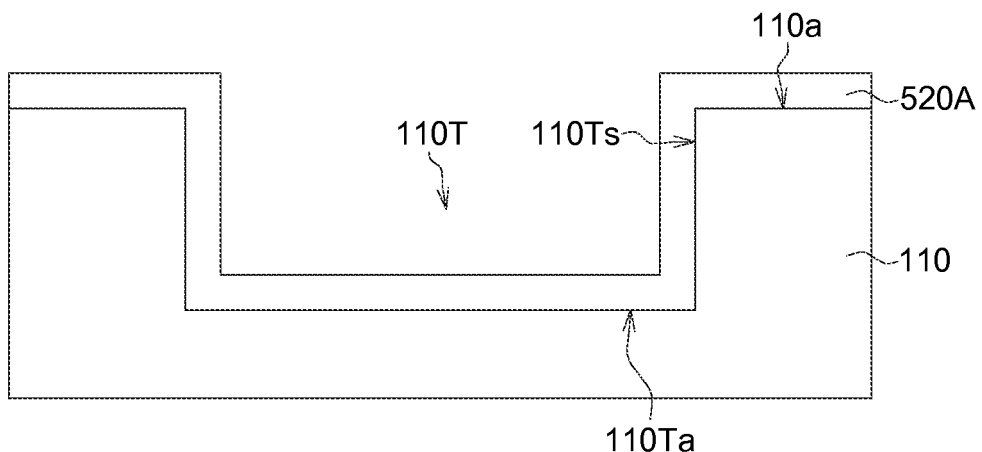

Referring to FIGS. 5A-5B, the substrate 110 is provided, which step comprises forming the trench 110T in the substrate 110.

As shown in FIG. 5A, a substrate 110A is provided. The substrate 110A is such as a metal oxide layer. This metal oxide layer can be deposited on a silicon substrate (not shown in drawings), on an inter-layer dielectric (not shown in drawings), on an inter-metal dielectric (not shown in drawings), or in a Si-recessed trench (not shown in drawings).

Next, as shown in FIG. 5B, the trench 110T is formed in the metal oxide layer by such as an etching process for forming the substrate 110.

Referring to FIGS. 5B-5H, the stacked strip structure 120 is formed in the trench 110T. In the present embodiment, the manufacturing method of forming the stacked strip structure 120 in the trench 110T includes such as the following steps.

As shown in FIG. 5B, a conductive layer 520A is formed in the trench 110T. In the embodiment, the conductive layer 520A is formed on the sidewalls 110Ts of the trench 110T, the bottom 110Ta of the trench 110T, and the upper surface 110a of the substrate 110.

Figure 5C:
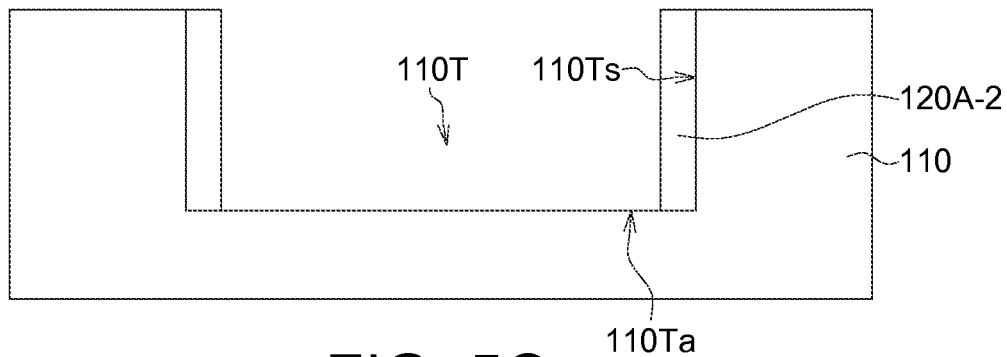

Then, as shown in FIG. 5C, portions of the conductive layer 520A on the bottom 110Ta of the trench 110T and on the upper surface 110a of the substrate 110 are removed for forming the two conductive spacers 121A-2 on the two opposite sidewalls 110Ts of the trench 110T.

Figure 5D:
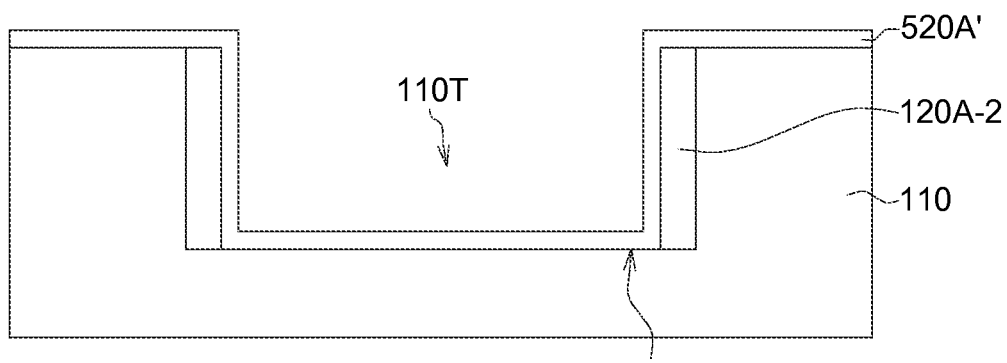

Next, as shown in FIG. 5D, a conductive layer 520A' is formed on the conductive spacers 121A-2 and the bottom 110Ta of the trench 110T.

Figure 5E:
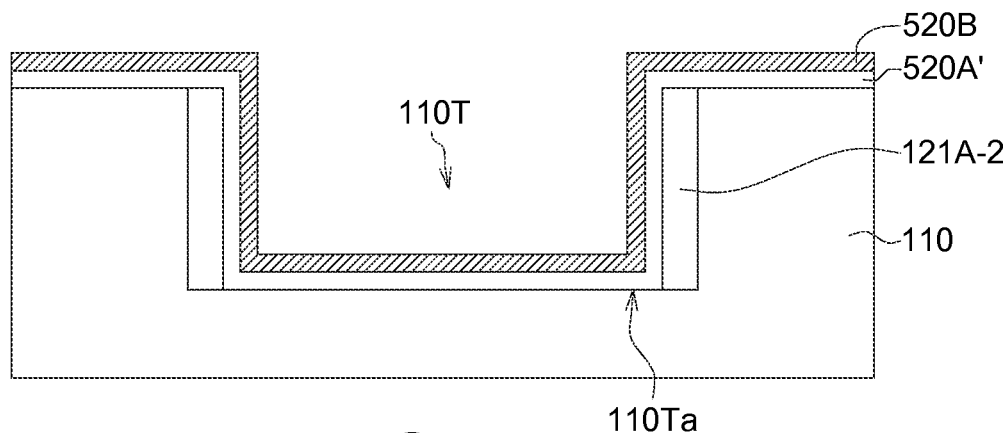

Next, as shown in FIG. 5E, an insulating layer 520B is formed on the conductive layer 520A'.

Figure 5F:
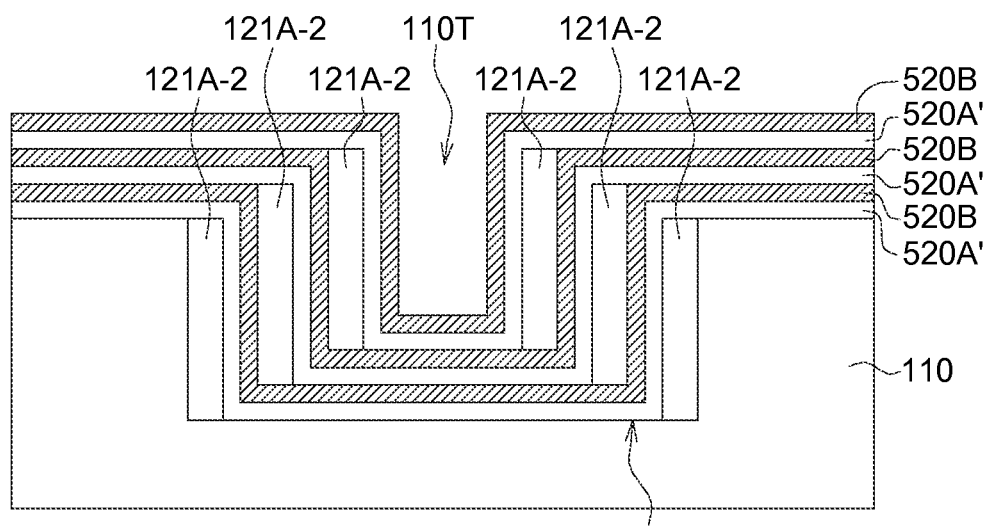

Next, as shown in FIG. 5F, two additional conductive spacers 121A-2 are formed on the insulating layer 520B. And then, the above-mentioned steps of forming the conductive layer 520A' on the conductive spacers 121A-2 and the bottom 110Ta of the trench 110T, forming the insulating layer 520B on the conductive layer 520A', and forming two conductive spacers 121A-2 on the insulating layer 520B are repeated in order, such that a structure having a plurality of the conductive layers 520A', a plurality of the conductive spacers 121A-2, and a plurality of the insulating layers 520B, as shown in FIG. 5F, is formed.

Figure 5G:
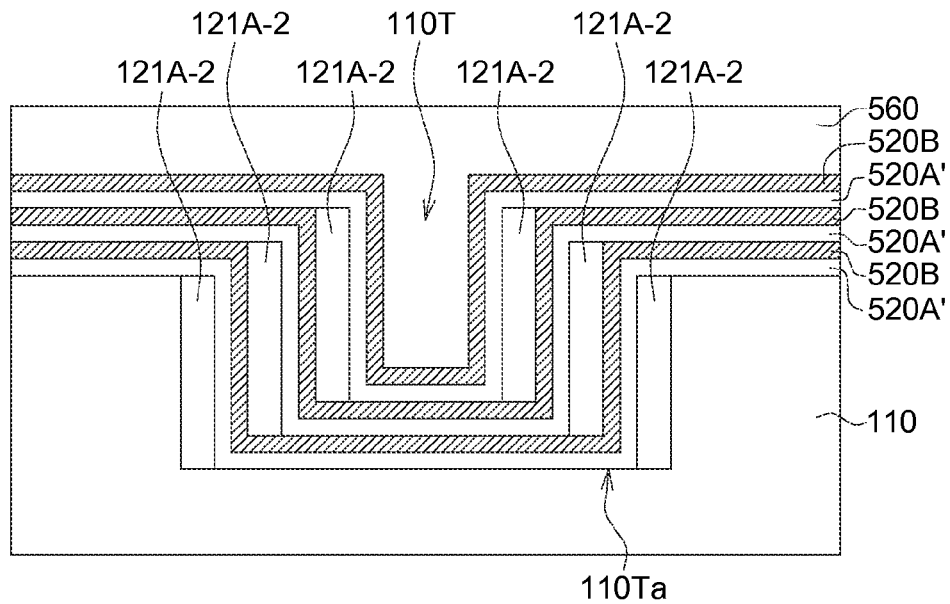

Next, as shown in FIG. 5G, a metal oxide layer 560 is deposited on the above-mentioned conductive layers 520A', conductive spacers 121A-2, and insulating layers 520B, and the deposited metal oxide layer 560 fills up the trench 110T.

Figure 5H:
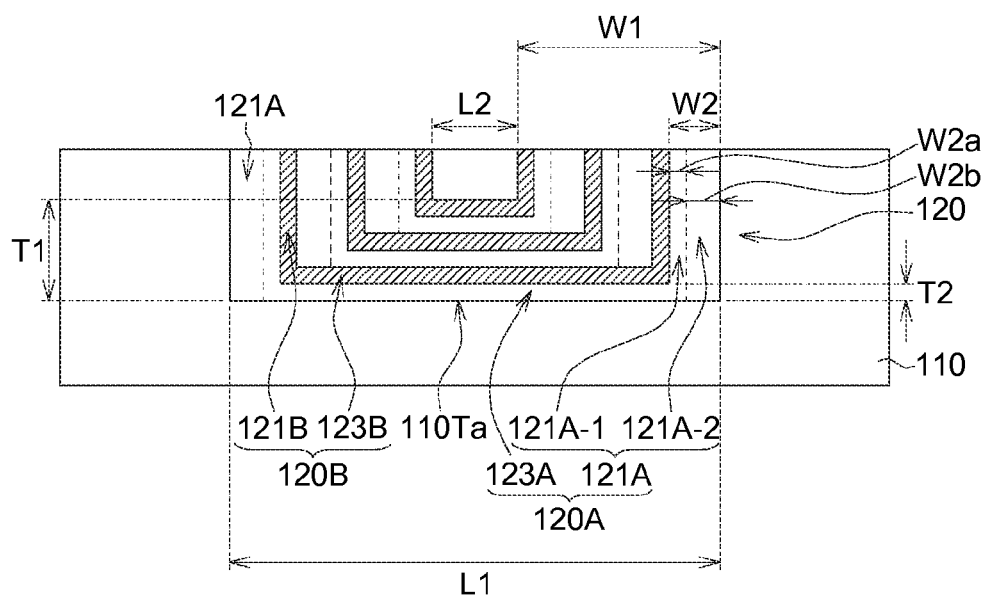

Next, as shown in FIG. 5H, the insulating layers 520B and the conductive layers 520A' are planarized. In the embodiment, the insulating layers 520B and the conductive layers 520A' are planarized by such as a CMP process. As shown in FIG. 5H, the vertical portions of each of the planarized conductive layers 520A' form two vertical conductive layers 121A-1; moreover, every two of the conductive spacers 121A-2 and every one of the vertical conductive layers 121A-1 form a conductive strip 120A. In addition, the planarized insulating layers 520B form the insulating strips 120B. As such, the interlaced conductive strips 120A and insulating strips 120B are formed, wherein the width W2 of the vertical conductive segments 121A is larger than the thickness T2 of the corresponding horizontal conductive segment 123A.

Next, referring to FIG. 1, a dielectric structure 140 is formed on the substrate 110, and at least one conductive structure 130 is formed in the dielectric structure 140. As shown in FIG. 1, the conductive structures 130 are electrically connected to the conductive strips 120A. As such, the semiconductor structure 100 as shown in FIG. 1 is formed.

Referring to FIG. 1, FIGS. 5B-5G, and FIGS. 6A-6C, a manufacturing method of a semiconductor structure 200 according to another embodiment of the present disclosure is illustrated.

Figure 6A:
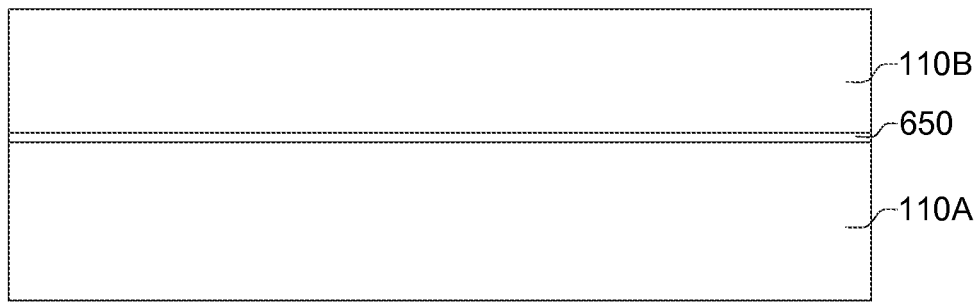
FIGS. 6A-6C illustrate a manufacturing method of a semiconductor structure according to another embodiment of the present disclosure.

As shown in FIG. 6A, the substrate 110A is provided, and the substrate 110A is such as a metal oxide layer. Next, an etching stop material layer 650 is formed on the substrate 110A, followed by the formation of a metal oxide layer 110B on the etching stop material layer 650. The etching stop material layer 650 is such as a metal nitride layer, for example, a silicon nitride layer.

Figure 6B:
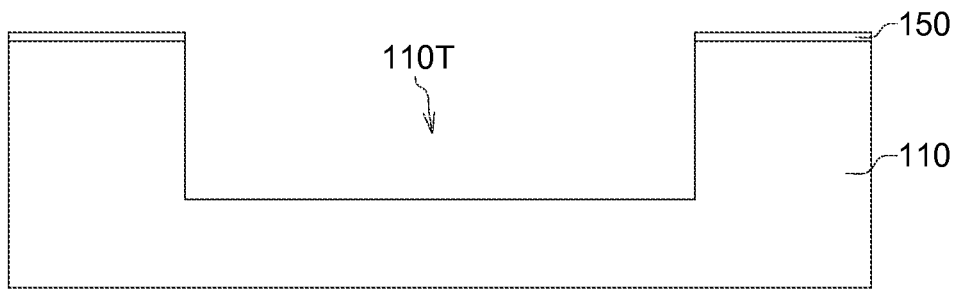

Next, as shown in FIG. 6B, the trench 110T and the etching stop layer 150 are formed. In the embodiment, the trench 110T and the etching stop layer 150 are formed by such as etching the metal oxide layer 110B, the etching stop material layer 650, and the substrate 110A. The top of the trench 110T are substantially aligned with the etching stop layer 150. As such, the etching stop layer 150 is formed on the substrate 110.

Next, referring to FIGS. 5B-5G, the stacked strip structure 120 is formed in the trench 110T according to a process similar to that illustrated by FIGS. 5B-5G.

Figure 6C:
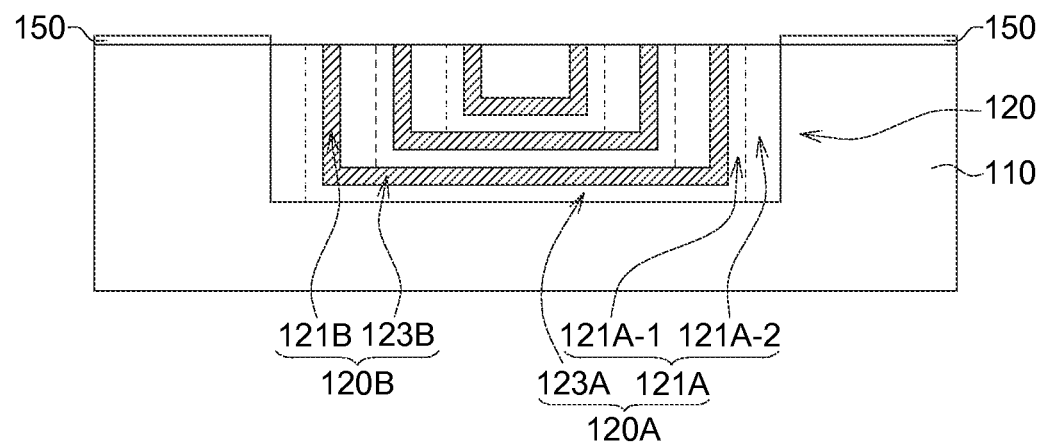

Next, as shown in FIG. 6C, the insulating layers and the conductive layers (e.g. the insulating layers 520B and the conductive layers 520A' as shown in FIG. 5H) are planarized by such as a CMP process for forming the interlaced conductive strips 120A and insulating strips 120B. In the present step, the etching stop layer 150 can be used as the stop layer for the CMP process, such that the stop position of the CMP process can be better controlled.

Next, referring to FIG. 2, the dielectric structure 140 is formed on the substrate 110, and the conductive structure 130 is formed in the dielectric structure 140, wherein the etching stop layer 150 is formed between the substrate 110 and the dielectric structure 140. As such, the semiconductor structure 200 as shown in FIG. 2 is formed.

Referring to FIG. 3, FIG. 5A, and FIGS. 7A-7H, a manufacturing method of a semiconductor structure 300 according to a further embodiment of the present disclosure is illustrated.

Figure 7A:
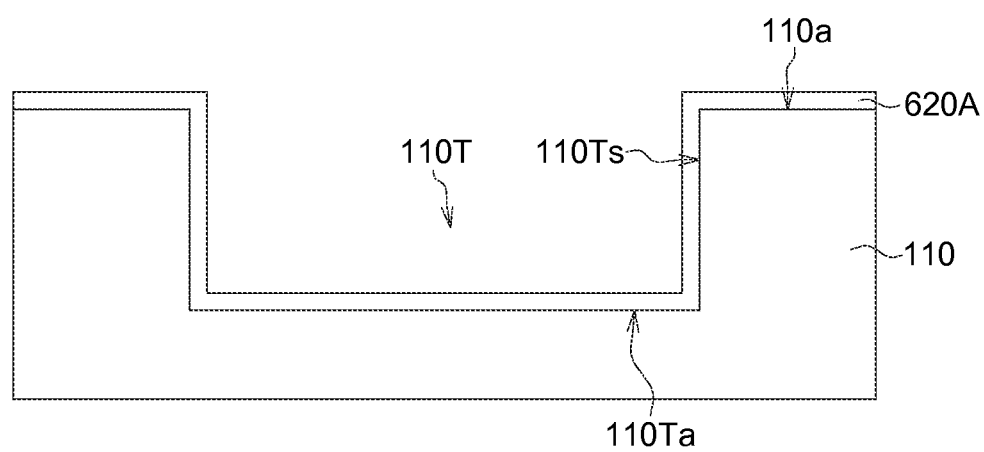
FIGS. 7A-7H illustrate a manufacturing method of a semiconductor structure according to a further embodiment of the present disclosure.

Referring to FIG. 5A and FIG. 7A, the substrate 110 is provided, which step includes formed the trench 110T in the substrate 110.

Referring FIGS. 7A-7H, the stacked strip structure 320 is formed in the trench 110T. In the present embodiment, the manufacturing method of forming the stacked strip structure 320 in the trench 110T includes such as the following steps.

As shown in FIG. 7A, a conductive layer 620A is formed in the trench 110T. In the embodiment, the conductive layer 620A is formed on the sidewalls 110Ts of the trench 110T, on the bottom 110Ta of the trench 110T, and on the upper surface 110a of the substrate 110.

Figure 7B:
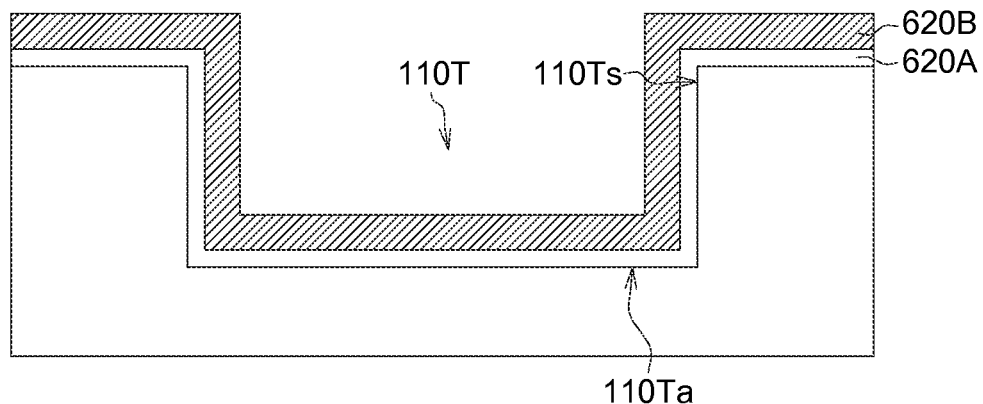

As shown in FIG. 7B, an insulating layer 620B is formed on the conductive layer 620A.

Figure 7C:
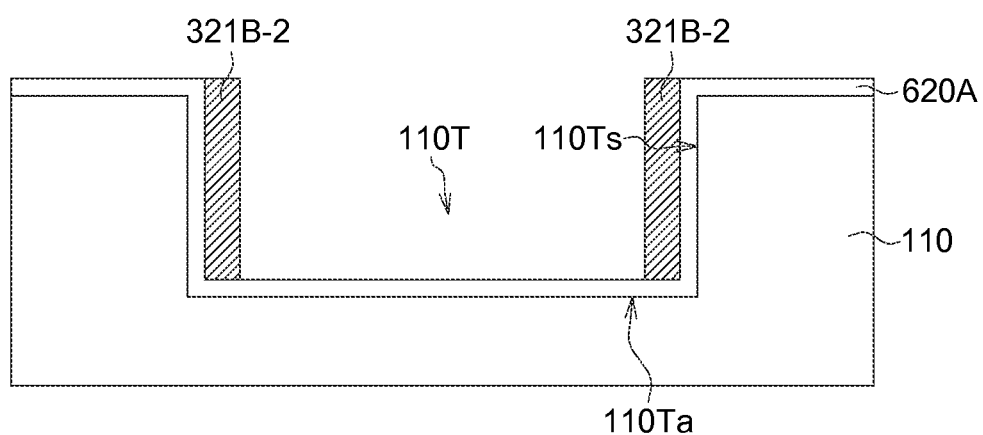

Then, as shown in FIG. 7C, portions of the insulating layer 620B located on the bottom 110Ta of the trench 110T and on the upper surface 110a of the substrate 110 are removed for forming the two insulating spacers 321B-2. In the embodiment, as shown in FIG. 7C, the two insulating spacers 321B-2 are formed on the conductive layer 620A corresponding to the two opposite sidewalls 110Ts of the trench 110T.

Figure 7D:
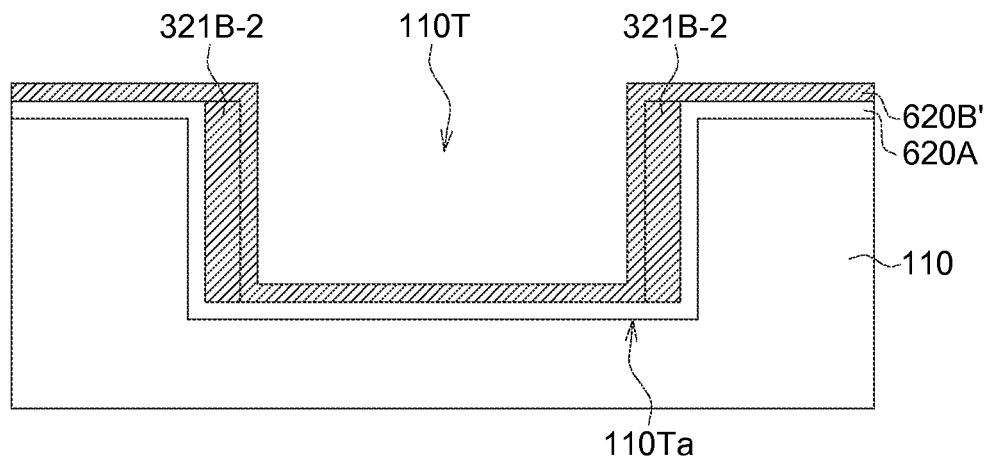

Next, as shown in FIG. 7D, an insulating layer 620B' is formed on the insulating spacers 321 B-2 and on the bottom 110Ta of the trench 110T.

Figure 7E:
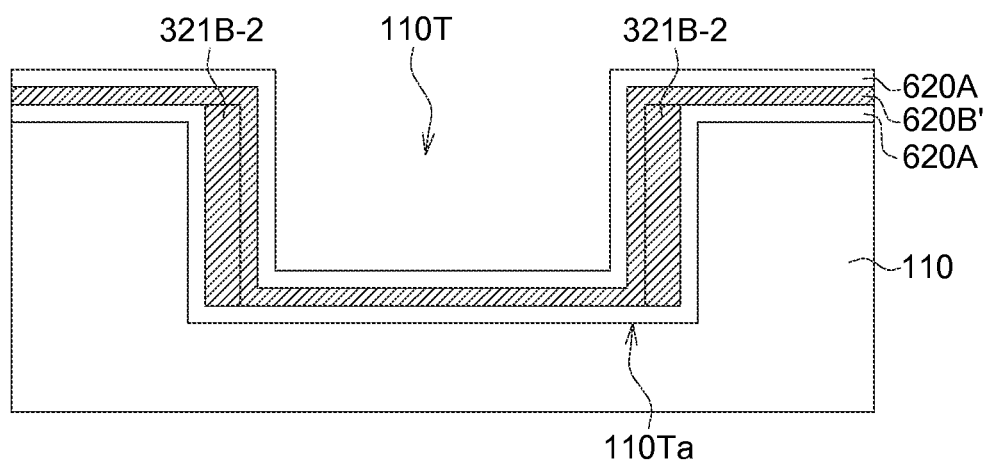

Next, as shown in FIG. 7E, a conductive layer 620A is formed on the insulating layer 620B'.

Figure 7F:
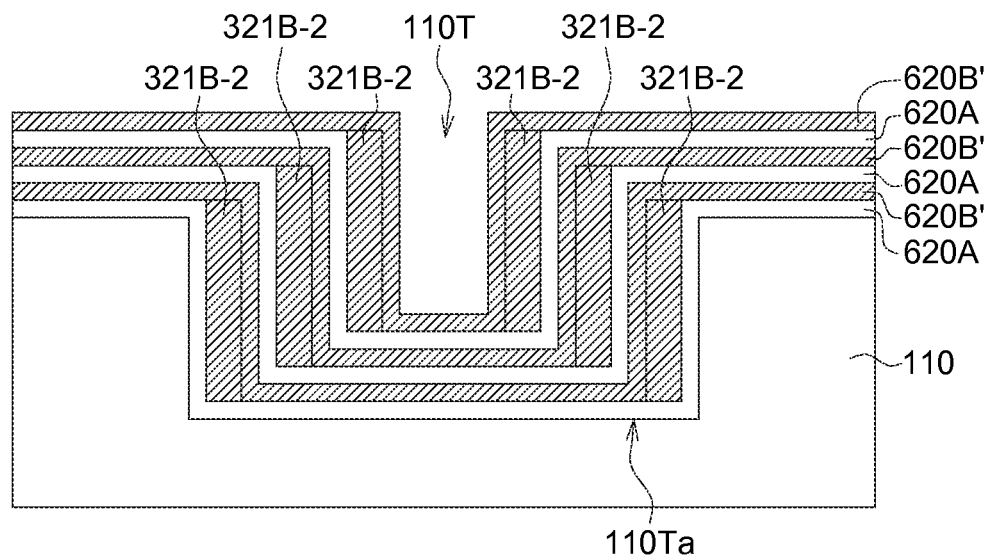

Next, as shown in FIG. 7F, the above-mentioned steps of forming the two insulating spacers 321B-2 on the conductive layer 620A, forming the insulating layer 620B' on the insulating spacers 321B-2 and on the bottom 110Ta of the trench 110T, and forming the conductive layer 620A on the insulating layer 620B' are repeated in order for forming a structure having a plurality of the conductive layers 620A, a plurality of the insulating spacers 321B-2, and a plurality of the insulating layers 620B', as shown in FIG. 7F.

Figure 7G:
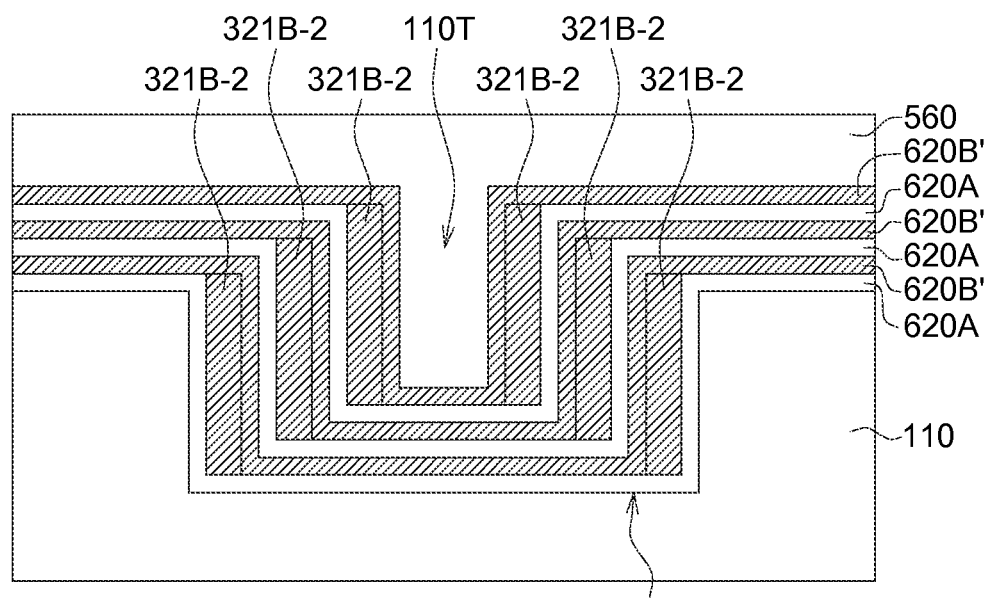

Next, as shown in FIG. 7G, the metal oxide layer 560 is deposited on the above-mentioned conductive layers 620A, insulating spacers 321B-2, and insulating layers 620B', and the deposited metal oxide layer 560 fills up the trench 110T.

Figure 7H:
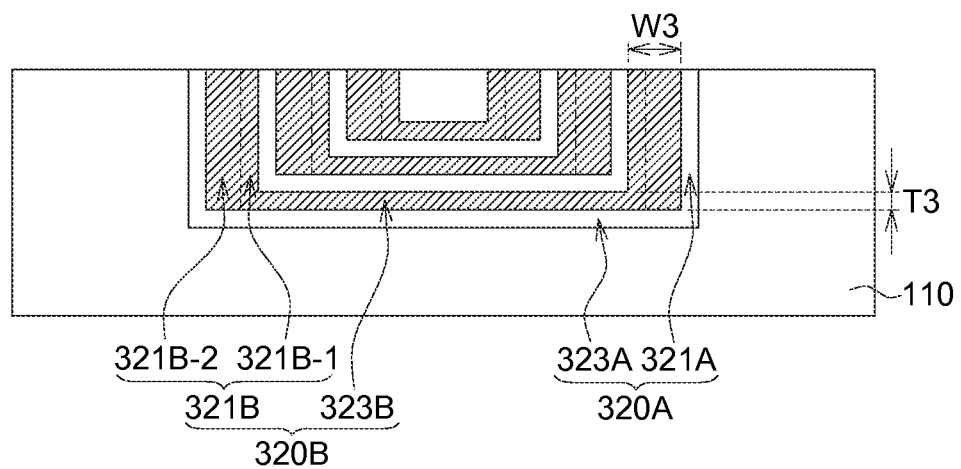

Next, as shown in FIG. 7H, the insulating layers 620B' and the conductive layers 620A are planarized. In the embodiment, the insulating layers 620B' and the conductive layers 620A are planarized by such as a CMP process. As shown in FIG. 7H, the vertical portions of each of the planarized insulating layers 620B' form two vertical insulating layers 321B-1; moreover, every two of the insulating spacers 321B-2 and every one of the vertical insulating layers 321B-1 form an insulating strip 320B. In addition, the planarized conductive layers 620A form conductive strips 320A. As such, the interlaced conductive strips 320A and insulating strips 320B are formed, wherein the width W3 of the vertical insulating segments 321B is larger than the thickness T3 of the corresponding horizontal insulating segment 323B.

Next, referring to FIG. 3, the dielectric structure 140 is formed on the substrate 110, and the conductive structure 130 is formed in the dielectric structure 140. As shown in FIG. 3, the conductive structures 130 are electrically connected to the conductive strips 320A. As such, the semiconductor structure 300 as shown in FIG. 3 is formed.

Below is provided with an illustration of a manufacturing method of a semiconductor structure 400 according to a still further embodiment of the present disclosure. Please refer to FIG. 4, FIGS. 5A-5G, and FIGS. 7A-7H.

At first, as shown in FIGS. 5A-5B, the substrate 110 is provided, and the trench 110T is formed in the substrate 110.

Next, as shown in FIGS. 5B-5D, two conductive spacers 121A-2 are formed on two opposite sidewalls 110Ts of the trench 110T, and the conductive layer 520A' is formed on the conductive spacers 121A-2 and on the bottom 110Ta of the trench 110T.

Next, referring to FIGS. 5B-5D and 7B-7D, two insulating spacers 321B-2 are formed on the conductive layer 620A corresponding to the two sidewalls 110Ts of the trench 110T, wherein the conductive layer 620A corresponds to the conductive layer 520A' as shown in FIGS. 5B-5D, and the insulating layer 620B' is formed on the insulating spacers 321B-2 and on the bottom 110Ta of the trench 110T.

Next, the above-mentioned steps illustrated referring to FIGS. 5B-5D and 7B-7D are repeated in order for forming a plurality of the conductive spacers 121A-2, a plurality of the conductive layers 520A' (the conductive layers 620A), a plurality of the insulating spacers 321B-2, and a plurality of the insulating layers 620B' on the substrate 110.

Next, the metal oxide layer 560 as shown in FIG. 5G is deposited on the above-mentioned conductive spacers 121A-2, conductive layers 520A' (conductive layers 620A), insulating spacers 321B-2, and insulating layers 620B', and the deposited metal oxide layer 560 fills up the trench 110T.

Next, the insulating layers 620B' and the conductive layers 520A' (the conductive layers 620A) are planarized. In the embodiment, the planarization is performed by such as a CMP process. As such, similar to the above-mentioned embodiments, the interlaced conductive strips 120A and insulating strips 320B are formed.

Next, referring to FIG. 4, the dielectric structure 140 is formed on the substrate 110, and the conductive structure is formed in the dielectric structure 140. As shown in FIG. 4, the conductive structures 130 are electrically connected to the conductive strips 120A. As such, the semiconductor structure 400 as shown in FIG. 4 is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate having a trench;
   a stacked strip structure formed in the trench, comprising:
   a plurality of conductive strips, wherein each of the conductive strips has a horizontal conductive segment and two vertical conductive segments connected to the corresponding horizontal conductive segment, the horizontal conductive segments extend in a direction parallel to a bottom of the trench, and the vertical conductive segments extend in a direction perpendicular to the bottom of the trench; and
   a plurality of insulating strips, wherein the conductive strips and the insulating strips are interlaced, each of the insulating strips has a horizontal insulating segment and two vertical insulating segments connected to the corresponding horizontal insulating segment, and the vertical insulating segments extend in a direction parallel to the direction in which the vertical conductive segments extend; and
   at least one conductive structure electrically connected to at least one of the conductive strips;
   wherein the stacked strip structure has a horizontal stacked portion corresponding to the horizontal conductive segments and two vertical stacked portions corresponding to the vertical conductive segments, and a width of the vertical stacked portions is larger than a thickness of the horizontal stacked portion, and wherein a width of the vertical insulating segments is larger than a thickness of the corresponding horizontal insulating segment.

2. The semiconductor structure according to claim 1, wherein the at least one conductive structure is electrically connected to at least one of the vertical conductive segments.

3. The semiconductor structure according to claim 1, wherein a width of the vertical conductive segments is larger than a thickness of the corresponding horizontal conductive segment.

4. The semiconductor structure according to claim 3, wherein the thickness of the horizontal conductive segment is about 160-200 Å.

5. The semiconductor structure according to claim 1, wherein the thickness of the horizontal insulating segment is about 160-200 Å.

6. The semiconductor structure according to claim 1, further comprising:
   a dielectric structure formed on the substrate, wherein the at least one conductive structure is formed in the dielectric structure.

7. The semiconductor structure according to claim 6, further comprising:
   an etching stop layer formed between the substrate and the dielectric structure.

8. The semiconductor structure according to claim 1, wherein a ratio of the width of the vertical stacked portion to a length of the horizontal stacked portion is about 1:1000.

9. The semiconductor structure according to claim 1, wherein the substrate is a metal oxide layer.

* * * * *